(12) United States Patent
Sapre et al.

(10) Patent No.: US 8,211,808 B2
(45) Date of Patent: Jul. 3, 2012

(54) SILICON-SELECTIVE DRY ETCH FOR CARBON-CONTAINING FILMS

(75) Inventors: Kedar Sapre, Mountain View, CA (US); Jing Tang, Santa Clara, CA (US); Linlin Wang, San Jose, CA (US); Abhijit Basu Mallick, Palo Alto, CA (US); Nitin Ingle, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 343 days.

(21) Appl. No.: 12/551,180

(22) Filed: Aug. 31, 2009

(65) Prior Publication Data

US 2011/0053380 A1 Mar. 3, 2011

(51) Int. Cl.
*H01L 21/302* (2006.01)

(52) U.S. Cl. ........ 438/719; 438/714; 438/718; 216/81

(58) Field of Classification Search .......... 438/706, 438/710, 714, 723, 725, 726, 727, 712, 718, 438/719; 216/79, 81
See application file for complete search history.

(56) References Cited

U.S. PATENT DOCUMENTS

| | | | |
|---|---|---|---|
| 5,888,906 A | | 3/1999 | Sandhu et al. |
| 5,935,334 A * | | 8/1999 | Fong et al. ............ 118/723 ME |
| 6,440,863 B1 * | | 8/2002 | Tsai et al. .................... 438/710 |
| 6,569,773 B1 | | 5/2003 | Gellrich et al. |
| 6,796,314 B1 | | 9/2004 | Graff |
| 7,488,688 B2 | | 2/2009 | Chung et al. |
| 2003/0109143 A1 | | 6/2003 | Hsieh et al. |
| 2005/0001276 A1 * | | 1/2005 | Gao et al. ...................... 257/417 |
| 2005/0026431 A1 * | | 2/2005 | Kazumi et al. ................ 438/689 |
| 2005/0181588 A1 | | 8/2005 | Kim |
| 2005/0230350 A1 | | 10/2005 | Kao et al. |
| 2006/0166515 A1 * | | 7/2006 | Karim et al. .................. 438/788 |
| 2007/0099438 A1 | | 5/2007 | Ye et al. |
| 2007/0108404 A1 | | 5/2007 | Stewart et al. |
| 2008/0182382 A1 | | 7/2008 | Ingle et al. |

FOREIGN PATENT DOCUMENTS

| | | |
|---|---|---|
| JP | 2002-141349 | 5/2002 |
| JP | 2002-256235 | 9/2002 |
| WO | 99/62108 A2 | 12/1999 |
| WO | 2006/069085 A2 | 6/2006 |
| WO | WO 2011/025655 A2 | 3/2011 |

OTHER PUBLICATIONS

"Applied Siconi™ Preclean," Applied Materials, Inc., pp. 1-8, printed on Aug. 7, 2009.
Notification of Transmittal of the International Search Report and the Written Opinion of the International Searching Authority, or the Declaration; International Search Report and Written Opinion of the International Searching Authority for corresponding International Application No. PCT/US2010/045056 mailed Mar. 23, 2011, 10 pages.
Japanese Patent Office, Official Action for Application No. 2007-317207 mailed on Dec. 21, 2011, 2 pages.

* cited by examiner

*Primary Examiner* — Lan Vinh
(74) *Attorney, Agent, or Firm* — Kilpatrick Townsend & Stockton LLP (57) ABSTRACT

A method of etching silicon-and-carbon-containing material is described and includes a SiConi™ etch in combination with a flow of reactive oxygen. The reactive oxygen may be introduced before the SiConi™ etch reducing the carbon content in the near surface region and allowing the SiConi™ etch to proceed more rapidly. Alternatively, reactive oxygen may be introduced during the SiConi™ etch further improving the effective etch rate.

30 Claims, 4 Drawing Sheets

SILICON-SELECTIVE DRY ETCH FOR CARBON-CONTAINING FILMS

FIELD OF THE INVENTION

This application relates to manufacturing technology solutions involving equipment, processes, and materials used in the deposition, patterning, and treatment of thin-films and coatings, with representative examples including (but not limited to) applications involving: semiconductor and dielectric materials and devices, silicon-based wafers and flat panel displays (such as TFTs).

BACKGROUND OF THE INVENTION

Integrated circuits are made possible by processes which produce intricately patterned material layers on substrate surfaces. Producing patterned material on a substrate requires controlled methods of removal of exposed material. Chemical etching is used for a variety of purposes including transferring a pattern in photoresist into underlying layers, thinning layers or thinning lateral dimensions of features already present on the surface. Often it is desirable to have an etch process which etches a first material faster than a second helping, e.g., a pattern transfer process proceed. Such an etch process is said to be selective to the first material. As a result of the diversity of materials, circuits and processes, etch processes have been developed with a selectivity towards a variety of materials.

A SiConi™ etch involves the simultaneous exposure of a substrate to $NF_3$ and $NH_3$ plasma by-products and is largely conformal and selective towards silicon-containing layers, e.g. silicon, polysilicon and silicon dioxide. The SiConi™ etch can display other beneficial properties related to the mechanism by which material is processed on the surface of a substrate. The SiConi™ process produces solid by-products which grow on the surface of the substrate as substrate material is removed. The solid by-products are subsequently removed via sublimation when the temperature of the substrate is raised. One application of the SiConi™ etch is to remove thin native oxides ($SiO_x$, x<2) formed on silicon-containing layers prior to further processing. Another application involves cleaning a processing chamber of silicon-containing process remnants.

The accumulation of solid by-products increasingly slow the penetration of the process into the layer resulting in the ability to precisely control the depth of processing or etch rate. Allowed to etch to a standstill, the SiConi™ etch becomes a "self-limiting" process. By varying some process parameters, each self-limiting cycle of exposure and anneal can be relied upon to remove a tunable and predictable amount of material.

The selectivity of existing SiConi™ processes have been established for silicon, polysilicon and silicon oxide. Incorporating carbon into silicon-containing layers results in silicon oxide has proven beneficial by decreasing the dielectric constant. Carbon content has also improved the gapfill of trenches by temporarily increasing the flowability of the film. Existing SiConi™ etch processes do not etch some of these silicon-and-carbon containing layers at etch rates high enough to be useful in production environments.

BRIEF SUMMARY OF THE INVENTION

A method of etching silicon-and-carbon-containing material is described and includes a SiConi™ etch in combination with a flow of reactive oxygen. The reactive oxygen may be introduced before the SiConi™ etch reducing the carbon content in the near surface region and allowing the SiConi™ a etch to proceed more rapidly. Alternatively, reactive oxygen may be introduced during the SiConi™ etch further improving the effective etch rate.

In one embodiment, a method of etching a silicon-and-carbon-containing layer on a surface of a substrate in a substrate processing region of a substrate processing chamber includes flowing a fluorine-containing precursor and a hydrogen-containing precursor into a first remote plasma region fluidly coupled to the substrate processing region while forming a plasma in the first remote plasma region to produce plasma effluents; etching the silicon-and-carbon containing layer by flowing the plasma effluents and reactive oxygen into the substrate processing region while forming solid by-products on the surface of the substrate; and sublimating the solid by-products by increasing a temperature of the substrate above a sublimation temperature of the solid by-products.

In yet another embodiment, method of etching a silicon-and-carbon-containing layer on an interior surface bordering a substrate processing region within a substrate processing system includes flowing a fluorine-containing precursor and a hydrogen-containing precursor into a remote plasma region fluidly coupled to the substrate processing region while forming a plasma in the remote plasma region to produce plasma effluents; etching the silicon-and-carbon-containing layer by flowing the plasma effluents and reactive oxygen into the substrate processing region while forming solid by-products on the interior surface; and sublimating the solid by-products by increasing a temperature of the interior surface above a sublimation temperature of the solid by-products.

In yet another embodiment, a method of etching a silicon-and-carbon-containing layer on a surface of a substrate in a substrate processing region includes the sequential steps of flowing reactive oxygen into the substrate processing region to reduce a concentration of carbon in a near-surface region of the silicon-and-carbon-containing layer; etching the silicon-and-carbon-containing layer by flowing a fluorine-containing precursor and a hydrogen-containing precursor into a remote plasma region fluidly coupled to the substrate processing region while forming a plasma in the remote plasma region to produce plasma effluents, which are flown into the substrate processing region; and sublimating solid by-products left on the surface following the etching step by raising a temperature of the substrate above a sublimation temperature of the solid by-products.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

A method of etching silicon-and-carbon-containing material is described and includes a SiConi™ etch in combination with a flow of reactive oxygen. The reactive oxygen may be introduced before the SiConi™ etch reducing the carbon content in the near surface region and allowing the SiConi™ etch to proceed more rapidly. Alternatively, reactive oxygen may be introduced during the SiConi™ etch further improving the effective etch rate.

Embodiments of the invention are directed to methods of etching a silicon-and-carbon-containing film on a substrate. A highly reactive form of oxygen (including O and/or $O_3$ for example) serves to remove carbon from the near-surface region, allowing a silicon selective etch process, SiConi™, to proceed at a higher etch rate. The oxygen treatment may occur concurrent with the SiConi™ etch or the two steps may be alternated. If the two steps are alternated, adjacent steps may or may not have some overlap. Reactive oxygen as used herein will generally include ozone, molecular oxygen and atomic oxygen though the proportions can be altered by hardware or process modifications. Examples presented may indicate a flow of ozone but it is to be understood that the flow may contain other oxygen-containing species, such as atomic oxygen and molecular oxygen.

Figure 1:
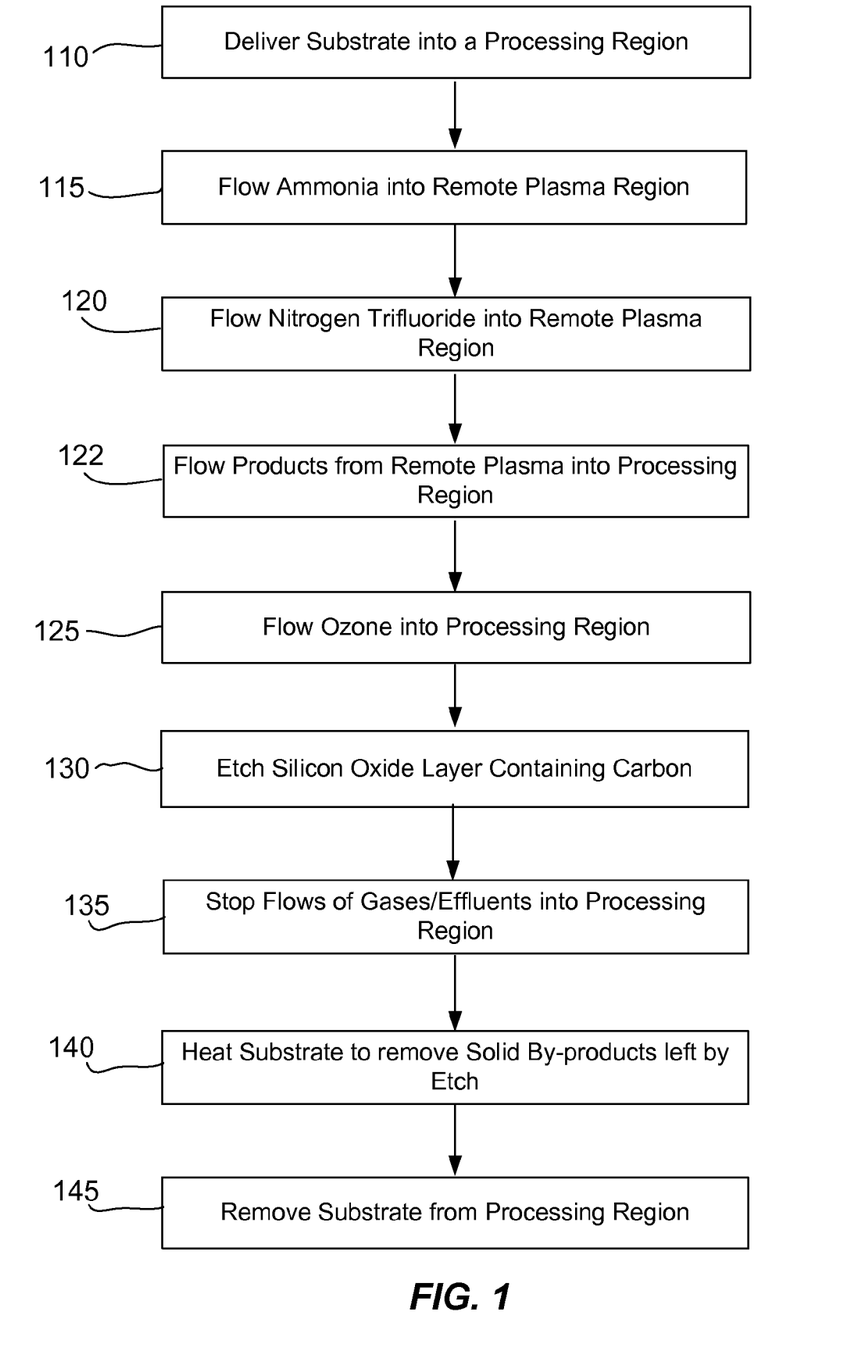
FIG. 1 is a flow chart of a silicon-and-carbon-containing material etch process according to disclosed embodiments.

In order to better understand and appreciate the invention, reference is now made to FIG. 1 which is a flow chart of a concurrent ozone and SiConi™ etch process according to disclosed embodiments. The process begins when a substrate is transferred into a processing chamber (operation 110). A silicon-and-carbon-containing layer is present on the surface of the substrate. Flows of ammonia and nitrogen trifluoride are initiated into a plasma region separate from the processing region (operations 115 and 120). The separate plasma region may be referred to as a remote plasma region herein and may be a distinct module from the processing chamber or a compartment within the processing chamber. Remote plasma effluents or products from the remote plasma are flowed into the processing region and allowed to interact with the substrate surface (operation 122).

In general, a SiConi™ etch involves concurrent flows of a fluorine-containing precursor and a hydrogen-containing precursor. Fluorine-containing precursors include nitrogen trifluoride, hydrogen fluoride, diatomic fluorine, monatomic fluorine and fluorine-substituted hydrocarbons or combinations thereof in different embodiments. Hydrogen-containing precursors include atomic hydrogen, diatomic hydrogen, ammonia, hydrocarbons, incompletely halogen-substituted hydrocarbons or combinations thereof in different embodiments. For simplicity, some discussions contained herein may refer to the exemplary SiConi™ etch using the combination of ammonia and nitrogen trifluoride.

Concurrently, reactive oxygen including ozone is flowed into the processing region (operation 125) to reduce a concentration of carbon at the surface and in the near-subsurface of the silicon-and-carbon containing layer. The reduced concentration of carbon allows the remote plasma effluents to remove material from the silicon-and-carbon containing layer more rapidly than if the ozone gas was not available. The layer is etched (operation 130) and the flows of the gases are stopped (operation 135). The substrate is heated to sublimate the solid by-products left by etch process (operation 140) and the substrate is removed from the processing region (operation 145).

Reactive oxygen may be generated in an ozone generator of a variety of types and typically includes ozone and molecular oxygen ($O_2$). Many ozone generators employ an electrical discharge and/or an optical excitation (e.g. from Xe arc lamps) imparted to an oxygen-containing gas (usually molecular oxygen). The proportions of the components vary as the reactive oxygen flows away from the ozone generator unit with the proportion of molecular oxygen tending to increase compared to ozone. Once the gas arrives in the processing region, ozone is more effective than molecular oxygen at reducing the carbon concentration. Molecular oxygen has only a minor effect on the near-surface carbon concentration. Other allotropes of oxygen are less stable but may still be present in the reactive oxygen mixture and some may be even more effective than ozone at reducing near-surface carbon concentration.

Reactive oxygen may also be created within a remote plasma region of a remote plasma system. In this case the reactive oxygen may include ozone, molecular oxygen and atomic oxygen. Atomic oxygen may be even more effective than ozone at reducing carbon concentration. One suitable remote plasma system is the ASTRON® generator available from Applied Science and Technology, Inc. of Woburn, Mass. The ASTRON® generator utilizes a low-field toroidal plasma to dissociate a process gas. In one example, the plasma dissociates a process gas including molecular oxygen and a carrier gas such as argon to generate reactive oxygen. A remote plasma region integrated to the substrate processing system may also be used provided that the system is able to produce similarly high plasma densities to the ASTRON® generator. Regardless of the location of the remote plasma region, the reactive oxygen may be generated within the remote plasma region by flowing molecular oxygen into the region. Other oxygen-containing sources can be flown into the region including precursors containing nitrogen and oxygen (e.g. $N_2O$, $NO_2$).

Figure 2:
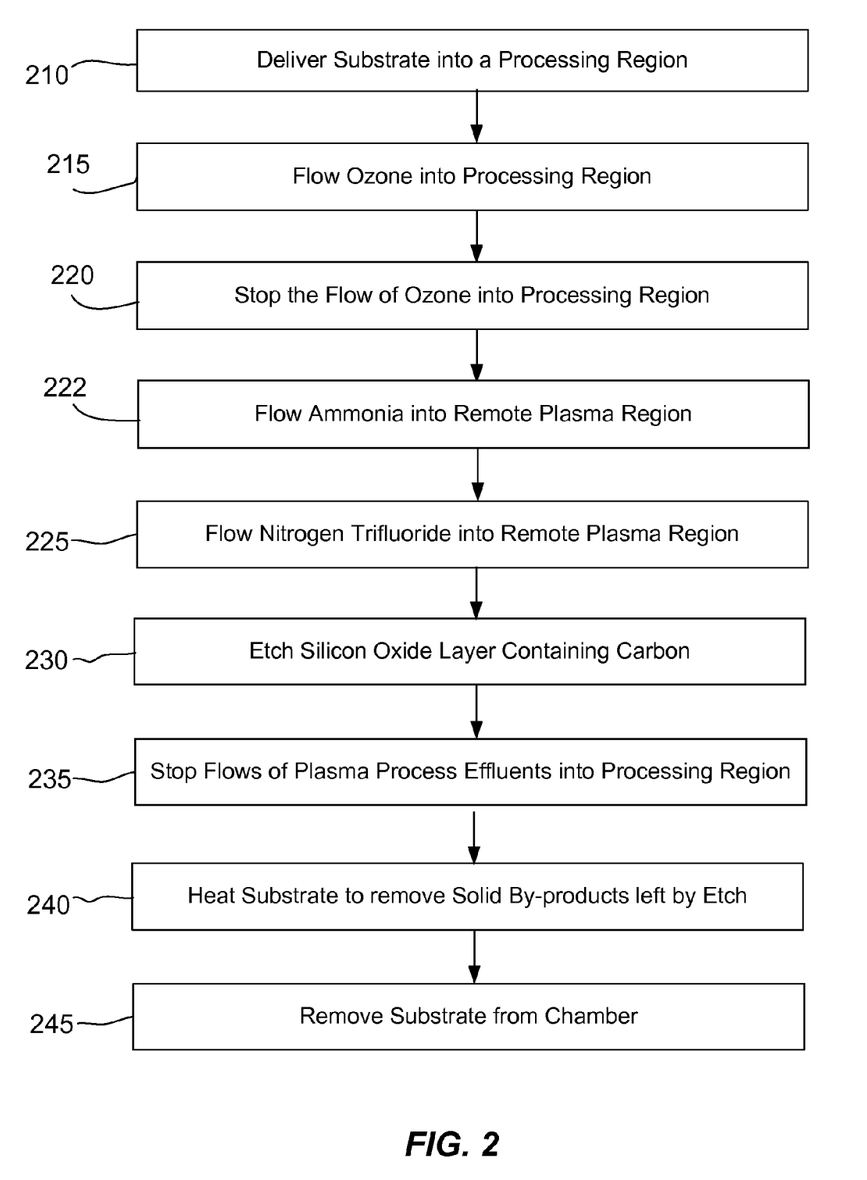
FIG. 2 is a flow chart of a silicon-and-carbon-containing material etch process according to disclosed embodiments.

A sequential process is shown in FIG. 2. The process begins similarly to the process depicted in FIG. 1, when a substrate is transferred into a processing chamber (operation 210). A silicon-and-carbon-containing layer is present on the surface of the substrate. A flow of ozone is initiated into the processing region (operation 215) to reduce a concentration of carbon at the surface and in the near-subsurface of the silicon-and-carbon containing layer. Following a termination of flow of ozone (operation 220) flows of ammonia and nitrogen trifluoride are begun into a plasma region separate from the processing region (operations 222 and 225). Remote plasma effluents are flowed into the processing region where they can interact with the substrate surface. The reduced concentration of carbon brought on by the previous exposure to ozone allows the remote plasma effluents to remove material from the silicon-and-carbon-containing layer more rapidly than if the ozone gas had not been made available to react with the layer. The layer is etched (operation 230) and the flows of gases and remote plasma effluents into the processing region are stopped (operation 235). The substrate is then heated to sublimate the solid by-products left by etch process (operation 240) and the substrate is removed from the processing region (operation 245).

In a sequential process as with the concurrent process, an ozone generator, an ASTRON® generator or an integrated remote plasma region may be used to produce the flow of reactive oxygen. The same remote plasma region(s) used to excite the flows of ammonia and nitrogen trifluoride may also be used to produce the flow of reactive oxygen provided, again, that they possess the ability to produce similarly high plasma densities to the ASTRON® generator.

The sequence of operations 215-240 may be repeated two or more times before removing the substrate from the chamber in order to remove more material than a single cycle would remove. Using the processes and hardware described in the next section, each cycle may remove between about 50 Å and about 300 Å, between about 75 Å and about 200 Å or between about 100 Å and about 150 Å in different embodiments. Additional oxidizing-SiConi™ etch process parameters and process details are disclosed in the course of describing an exemplary processing system.

Exemplary Processing System

Figure 3:
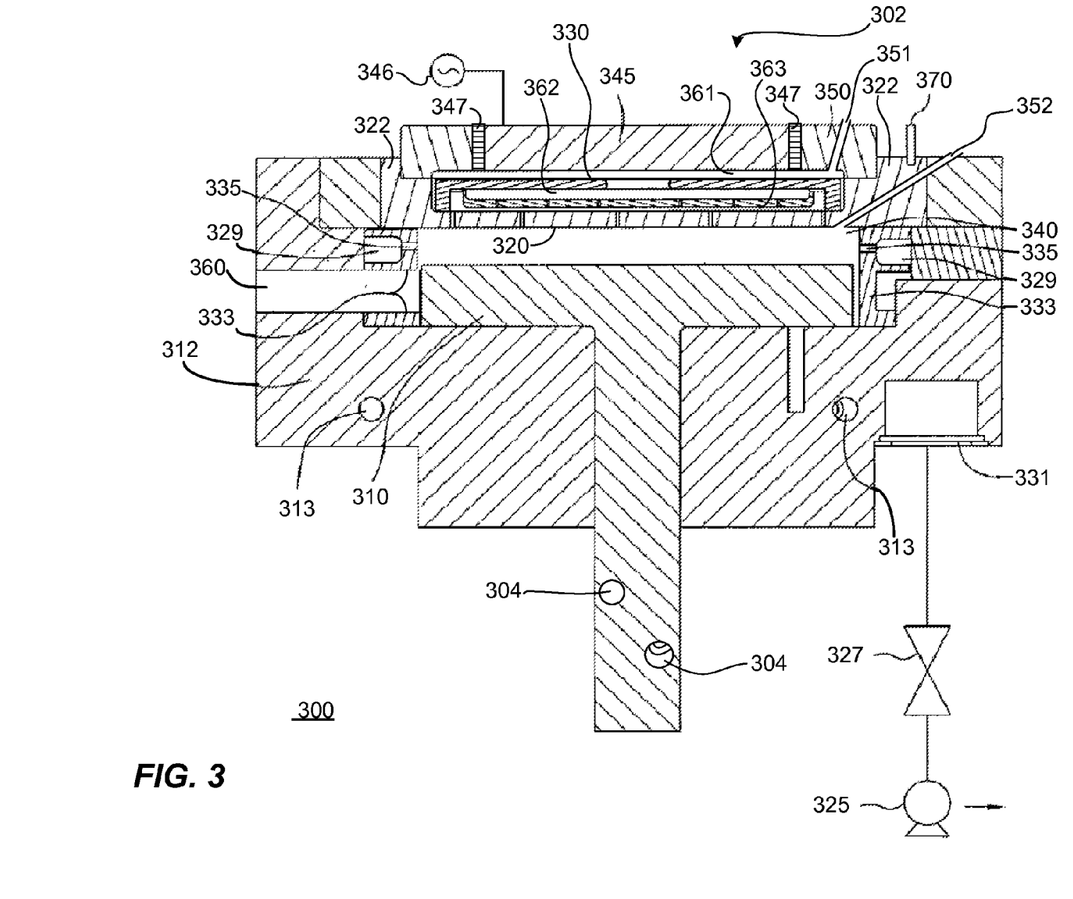
FIG. 3 is a cross-sectional view of a processing chamber according to disclosed embodiments.

FIG. 3 is a partial cross sectional view showing an illustrative processing chamber 300, in which, embodiments of the invention may be carried out. Generally, ammonia and nitrogen trifluoride may be introduced through one or more apertures 351 into remote plasma region(s) 361-363 and excited by plasma power source 346. Reactive oxygen may be introduced through aperture(s) 352, bypassing remote plasma region(s) 361-363. The reactive oxygen may be formed within an ozone generator or another remote plasma source (not shown).

In one embodiment, the processing chamber 300 includes a chamber body 312, a lid assembly 302, and a support assembly 310. The lid assembly 302 is disposed at an upper end of the chamber body 312, and the support assembly 310 is at least partially disposed within the chamber body 312. The processing chamber 300 and the associated hardware are preferably formed from one or more process-compatible materials (e.g. aluminum, stainless steel, etc.).

Figure 4:
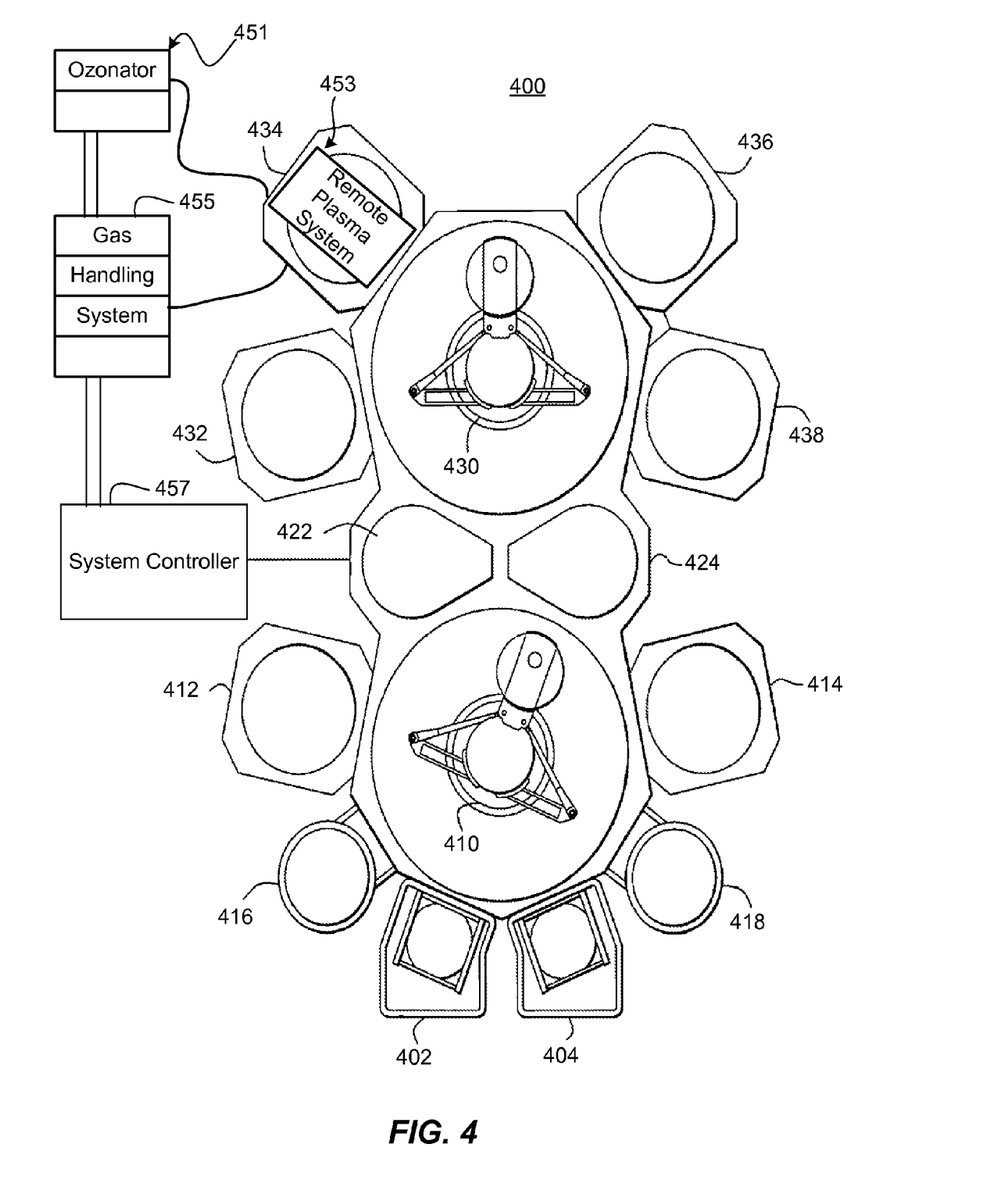
FIG. 4 is a processing system according to disclosed embodiments.

The chamber body 312 includes a slit valve opening 360 formed in a sidewall thereof to provide access to the interior of the processing chamber 300. The slit valve opening 360 is selectively opened and closed to allow access to the interior of the chamber body 312 by a wafer handling robot (not shown). In one embodiment, a wafer can be transported in and out of the processing chamber 300 through the slit valve opening 360 to an adjacent transfer chamber and/or load-lock chamber, or another chamber within a cluster tool. An exemplary cluster tool which may include processing chamber 300 is shown in FIG. 4.

In one or more embodiments, chamber body 312 includes a chamber body channel 313 for flowing a heat transfer fluid through chamber body 312. The heat transfer fluid can be a heating fluid or a coolant and is used to control the temperature of chamber body 312 during processing and substrate transfer. The temperature of the chamber body 312 is important to prevent unwanted condensation of the gas or byproducts on the chamber walls. Exemplary heat transfer fluids include water, ethylene glycol, or a mixture thereof. An exemplary heat transfer fluid may also include nitrogen gas. Support assembly 310 may have a support assembly channel 304 for flowing a heat transfer fluid through support assembly 310 thereby affecting the substrate temperature.

The chamber body 312 can further include a liner 333 that surrounds the support assembly 310. The liner 333 is preferably removable for servicing and cleaning. The liner 333 can be made of a metal such as aluminum, or a ceramic material. However, the liner 333 can be any process compatible material. The liner 333 can be bead blasted to increase the adhesion of any material deposited thereon, thereby preventing flaking of material which results in contamination of the processing chamber 300. In one or more embodiments, the liner 333 includes one or more apertures 335 and a pumping channel 329 formed therein that is in fluid communication with a vacuum system. The apertures 335 provide a flow path for gases into the pumping channel 329, which provides an egress for the gases within the processing chamber 300.

The vacuum system can include a vacuum pump 325 and a throttle valve 327 to regulate flow of gases through the processing chamber 300. The vacuum pump 325 is coupled to a vacuum port 331 disposed on the chamber body 312 and therefore, in fluid communication with the pumping channel 329 formed within the liner 333. The terms "gas" and "gases" are used interchangeably, unless otherwise noted, and refer to one or more reactants, catalysts, carrier, purge, cleaning, combinations thereof, as well as any other fluid introduced into the chamber body 312. The term "precursor" is used to refer to any process gas which takes part in a reaction to either remove or deposit material from a surface.

Apertures 335 allow the pumping channel 329 to be in fluid communication with a processing region 340 within the chamber body 312. The processing region 340 is defined by a lower surface of the lid assembly 302 and an upper surface of the support assembly 310, and is surrounded by the liner 333. The apertures 335 may be uniformly sized and evenly spaced about the liner 333. However, any number, position, size or shape of apertures may be used, and each of those design parameters can vary depending on the desired flow pattern of gas across the substrate receiving surface as is discussed in more detail below. In addition, the size, number and position of the apertures 335 are configured to achieve uniform flow of gases exiting the processing chamber 300. Further, the aperture size and location may be configured to provide rapid or high capacity pumping to facilitate a rapid exhaust of gas from the chamber 300. For example, the number and size of apertures 335 in close proximity to the vacuum port 331 may be smaller than the size of apertures 335 positioned farther away from the vacuum port 331.

A gas supply panel (not shown) is typically used to provide process gas(es) to the processing chamber 300 through one or more apertures 351. The particular gas or gases that are used depend upon the process or processes to be performed within the chamber 300. Illustrative gases can include, but are not limited to one or more precursors, reductants, catalysts, carriers, purge, cleaning, or any mixture or combination thereof. Typically, the one or more gases introduced to the processing chamber 300 flow into plasma volume 361 through aperture(s) 351 in top plate 350. Alternatively or in combination, processing gases may be introduced more directly through aperture(s) 352 into processing region 340. Aperture(s) 352 bypass the remote plasma excitation and are useful for processes involving gases that do not require plasma excitation or processes which do not benefit from additional excitation of the gases. Reactive oxygen created in a ozone generator may be introduced through aperture(s) into processing region 340 without passing through regions 361, 362 and 363. Electronically operated valves and/or flow control mechanisms (not shown) may be used to control the flow of gas from the gas supply into the processing chamber 300. Depending on the process, any number of gases can be delivered to the processing chamber 300, and can be mixed either in the processing chamber 300 or before the gases are delivered to the processing chamber 300.

The lid assembly 302 can further include an electrode 345 to generate a plasma of reactive species within the lid assembly 302. In one embodiment, the electrode 345 is supported by top plate 350 and is electrically isolated therefrom by inserting electrically isolating ring(s) 347 made from aluminum oxide or any other insulating and process compatible material. In one or more embodiments, the electrode 345 is coupled to a power source 346 while the rest of lid assembly 302 is connected to ground. Accordingly, a plasma of one or more process gases can be generated in remote plasma region composed of volumes 361, 362 and/or 363 between electrode 345 and annular mounting flange 322. In embodiments, annular mounting flange comprises or supports gas delivery plate 320. For example, the plasma may be initiated and maintained between electrode 345 and one or both blocker plates of blocker assembly 330. Alternatively, the plasma can be struck and contained between the electrode 345 and gas delivery plate 320, in the absence of blocker assembly 330. In either embodiment, the plasma is well confined or contained within the lid assembly 302. Accordingly, the plasma is a "remote plasma" since no active plasma is in direct contact with the substrate disposed within the chamber body 312. As a result, plasma damage to the substrate may be avoided since the plasma is separated from the substrate surface.

A wide variety of power sources 346 are capable of activating the ammonia and nitrogen trifluoride gases into reactive species. For example, radio frequency (RF), direct current (DC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the chamber 300. Exemplary remote plasma generators are available from vendors such as MKS Instruments, Inc. and Advanced Energy Industries, Inc. In the exemplary processing system an RF power supply is coupled to electrode 345. A higher-power microwave power source 346 is beneficial in the event that reactive oxygen will also be produced using power source 346.

The temperatures of the process chamber body 312 and the substrate may each be controlled by flowing a heat transfer medium through chamber body channel 313 and support assembly channel 304, respectively. Support assembly channel 304 may be formed within support assembly 310 to facilitate the transfer of thermal energy. Chamber body 312 and support assembly 310 may be cooled or heated independently. For example, a heating fluid may be flown through one while a cooling fluid is flown through the other.

Other methods may be used to control the substrate temperature. The substrate may be heated by heating the support assembly 310 (or a portion thereof, such as a pedestal) with a resistive heater or by some other means. In another configuration, gas delivery plate 320 may be maintained at a temperature higher than the substrate and the substrate can be elevated in order to raise the substrate temperature. In this case the substrate is heated radiatively or by using a gas to conduct heat from gas delivery plate 320 to the substrate. The substrate may be elevated by raising support assembly 310 or by employing lift pins.

During the etch processes described herein, chamber body 312 may be maintained within an approximate temperature range of between 50° C. and 80° C., between 55° C. and 75° C. or between 60° C. and 70° C. in different embodiments. During exposure to plasma effluents and/or oxidizing agents, the substrate may be maintained below about 100° C., below about 65° C., between about 15° C. and about 50° C. or between about 22° C. and about 40° C. in different embodiments.

Plasma effluents include a variety of molecules, molecular fragments and ionized species. Currently entertained theoretical mechanisms of SiConi™ etching may or may not be entirely correct but plasma effluents are thought to include $NH_4F$ and $NH_4F.HF$ which react readily with low temperature substrates described herein. Plasma effluents may react with a silicon oxide surface to form $(NH_4)_2SiF_6$, $NH_3$ and $H_2O$ products. The $NH_3$ and $H_2O$ are vapors under the processing conditions described herein and may be removed from processing region 340 by vacuum pump 325. A thin discontinuous layer of $(NH_4)_2SiF_6$ solid by-products is left behind on the substrate surface.

Following exposure to plasma effluents and the associated accumulation of solid by-products, the substrate may be heated to remove the by-products. In embodiments, the gas delivery plate 320 is heatable by incorporating heating element 370 within or near gas delivery plate 320. The substrate may be heated by reducing the distance between the substrate and the heated gas delivery plate. The gas delivery plate 320 may be heated to between about 100° C. and 150° C., between about 110° C. and 140° C. or between about 120° C. and 130° C. in different embodiments. By reducing the separation between the substrate and the heated gas delivery plate, the substrate may be heated to above about 75° C., above about 90° C., above about 100° C. or between about 115° C. and about 150° C. in different embodiments. The heat radiated from gas delivery plate 320 to the substrate should be made sufficient to dissociate or sublimate solid $(NH_4)_2SiF_6$ on the substrate into volatile $SiF_4$, $NH_3$ and HF products which may be pumped away from processing region 340.

Ammonia (or hydrogen-containing precursors in general) may be flowed into remote plasma volume 361 at rates between about 50 sccm and about 300 sccm, between about 75 sccm and about 250 sccm, between about 100 sccm and about 200 sccm or between about 120 sccm and about 170 sccm in different embodiments. Nitrogen trifluoride (or fluorine-containing precursors in general) may be flowed into remote plasma volume 361 at rates between about 25 sccm and about 150 sccm, between about 40 sccm and about 175 sccm, between about 50 sccm and about 100 sccm or between about 60 sccm and about 90 sccm in different embodiments. Combined flow rates of hydrogen-containing and fluorine-containing precursors into the remote plasma region may account for 0.05% to about 20% by volume of the overall gas mixture; the remainder being a carrier gas. In one embodiment, a purge or carrier gas is first initiated into the remote plasma region before those of the reactive gases to stabilize the pressure within the remote plasma region.

Production of the plasma effluents occurs within volumes 361, 362 and/or 363 by applying plasma power to electrode 345 relative to the rest of lid assembly 302. Plasma power can be a variety of frequencies or a combination of multiple frequencies. In the exemplary processing system the plasma is provided by RF power delivered to electrode 345. The RF power may be between about 1 W and about 1000 W, between about 5 W and about 600 W, between about 10 W and about 300 W or between about 20 W and about 100 W in different embodiments. The RF frequency applied in the exemplary processing system may be less than about 200 kHz, less than about 150 kHz, less than about 120 kHz or between about 50 kHz and about 90 kHz in different embodiments.

When using an ozone generator to form reactive oxygen, a variety of types of ozone generator may be used. The ozone generator may be near or separated from the processing system. The ozone generator may be positioned outside the cleanroom or gray area housing the processing system. Ozone is typically flowed along with more stable molecular oxygen ($O_2$) and, in embodiments, the combination will be referred to herein as reactive oxygen. The flow rate of the reactive oxygen may be between about 1 slm and about 50 slm, between about 2 slm and about 30 slm or between about 5 slm and about 10 slm in different embodiments. The flow of the reactive oxygen may be combined with an additional flow of a relatively inert gas (e.g. He, Ar) prior to entering the processing region 340 through aperture(s) 352. The relatively inert carrier gas may be included for a variety of benefits including an increase in the plasma density.

Processing region 340 can be maintained at a variety of pressures during the flow of ozone, oxygen, carrier gases and/or plasma effluents into processing region 340. The pressure may be maintained between about 500 mTorr and about 30 Torr, between about 1 Torr and about 10 Torr or between about 3 Torr and about 6 Torr in different embodiments. Lower pressures may also be used within processing region 340. The pressure may be maintained below or about 500 mTorr, below or about 250 mTorr, below or about 100 mTorr, below or about 50 mTorr or below or about 20 mTorr in different embodiments.

In one or more embodiments, the processing chamber 300 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum.

FIG. 4 is a schematic top-view diagram of an illustrative multi-chamber processing system 400. The system 400 can include one or more load lock chambers 402, 404 for transferring of substrates into and out of the system 400. Typically, since the system 400 is under vacuum, the load lock chambers 402, 404 may "pump down" the substrates introduced into the system 400. A first robot 410 may transfer the substrates between the load lock chambers 402, 404, and a first set of one or more substrate processing chambers 412, 414, 416, 418 (four are shown). Each processing chamber 412, 414, 416, 418, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The first robot 410 can also transfer substrates to/from one or more transfer chambers 422, 424. The transfer chambers 422, 424 can be used to maintain ultrahigh vacuum conditions while allowing substrates to be transferred within the system 400. A second robot 430 can transfer the substrates between the transfer chambers 422, 424 and a second set of one or more processing chambers 432, 434, 436, 438. Similar to processing chambers 412, 414, 416, 418, the processing chambers 432, 434, 436, 438 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 412, 414, 416, 418, 432, 434, 436, 438 may be removed from the system 400 if not necessary for a particular process to be performed by the system 400.

An ozone generator 451 may be positioned outside the clean room and supply lines carry process gases from the ozonator 451 to a process chamber 434 used for an oxidizing-SiConi™ process described herein. A remote plasma system (RPS) 453 may be positioned remotely or integrated (as shown) with the SiConi™ processing chamber 434. Alternatively, the RPS 453 may be a separate from but in close proximity or even physically attached to processing chamber 434. The reactive oxygen excited within RPS 453 may be introduced more directly (e.g. through aperture(s) 352) into processing region 340 whereas other process gases from gas handling system 455 are introduced through apertures 351, excited by remote plasma(s) within process volumes 361, 362 and/or 363.

System controller 457 is used to control motors, valves, flow controllers, power supplies and other functions required to carry out process recipes described herein. System controller 457 may rely on feedback from optical sensors to determine and adjust the position of movable mechanical assemblies. Mechanical assemblies may include the robot, throttle valves and susceptors which are moved by motors under the control of system controller 457.

In an exemplary embodiment, system controller 457 includes a hard disk drive (memory), USB ports, a floppy disk drive and a processor. System controller 457 includes analog and digital input/output boards, interface boards and stepper motor controller boards. Various parts of multi-chamber processing system 400 which contains processing chamber 300 are controlled by system controller 457. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for depositing a film on a substrate or a process for cleaning chamber 15 can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A gas in an "excited state" describes a gas wherein at least some of the gas molecules are in vibrationally-excited, dissociated and/or ionized states. A gas may be a combination of two or more gases. The term trench is used throughout with no implication that the etched geometry has a large horizontal aspect ratio. Viewed from above the surface, trenches may appear circular, oval, polygonal, rectangular, or a variety of other shapes.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching a silicon-and-carbon-containing layer on a surface of a substrate in a substrate processing region of a substrate processing chamber, the method comprising:
   flowing a fluorine-containing precursor and a hydrogen-containing precursor into a first remote plasma region fluidly coupled to the substrate processing region while forming a plasma in the first remote plasma region to produce plasma effluents;
   etching the silicon-and-carbon containing layer by flowing the plasma effluents and reactive oxygen into the substrate processing region while forming solid by-products on the surface of the substrate; and
   after the etching step, sublimating the solid by-products by increasing a temperature of the substrate above a sublimation temperature of the solid by-products.

2. The method of claim 1 wherein the fluorine-containing precursor comprises at least one precursor selected from the group consisting of nitrogen trifluoride, hydrogen fluoride, diatomic fluorine, monatomic fluorine and fluorine-substituted hydrocarbons.

3. The method of claim 1 wherein the hydrogen-containing precursor comprises at least one precursor selected from the group consisting of atomic hydrogen, molecular hydrogen, ammonia, a hydrocarbon and an incompletely halogen-substituted hydrocarbon.

4. The method of claim 1 wherein a temperature of the substrate is increased by at least 20° C. above the temperature of the substrate during the etching operation in order to sublimate the solid by-products.

5. The method of claim 1 wherein a temperature of the substrate during the etching operation is less than or about 80° C. and the temperature of the substrate during the sublimating operation is greater than 100° C.

6. The method of claim 1 wherein a temperature of the substrate during the etching operation is less than or about 100° C. and the temperature of the substrate during the sublimating operation is between about 115° C. and 150° C.

7. The method of claim 1 wherein the surface of the substrate is patterned.

8. The method of claim 1 wherein the reactive oxygen comprises ozone.

9. The method of claim 1 wherein the reactive oxygen comprises atomic oxygen (O).

10. The method of claim 1 wherein the reactive oxygen comprises ozone generated in an ozone generator fluidly coupled to the substrate processing region.

11. The method of claim 1 wherein the reactive oxygen comprises ozone generated by flowing molecular oxygen ($O_2$) into a second remote plasma region.

12. The method of claim 1 wherein the reactive oxygen comprises ozone generated by flowing a nitrogen-and-oxygen-containing precursor into a second remote plasma region.

13. The method of claim 1 wherein the reactive oxygen does not flow through the first remote plasma region.

14. The method of claim 1 wherein the operations are repeated to remove additional material from the silicon-and-carbon-containing layer.

15. The method of claim 1 wherein a thickness of about 150 Å or less is removed from the silicon-and-carbon-containing layer.

16. The method of claim 11 wherein the second remote plasma region is coupled to a microwave power source.

17. A method of etching a silicon-and-carbon-containing layer on an interior surface bordering a substrate processing region within a substrate processing system, the method comprising:
   flowing a fluorine-containing precursor and a hydrogen-containing precursor into a remote plasma region fluidly coupled to the substrate processing region while forming a plasma in the remote plasma region to produce plasma effluents;
   etching the silicon-and-carbon-containing layer by flowing the plasma effluents and reactive oxygen into the substrate processing region while forming solid by-products on the interior surface; and
   after the etching step, sublimating the solid by-products by increasing a temperature of the interior surface above a sublimation temperature of the solid by-products.

18. The method of claim 17 wherein the fluorine-containing precursor comprises at least one precursor selected from the group consisting of nitrogen trifluoride, hydrogen fluoride, diatomic fluorine, monatomic fluorine and fluorine-substituted hydrocarbons.

19. The method of claim 17 wherein the hydrogen-containing precursor comprises at least one precursor selected from the group consisting of atomic hydrogen, molecular hydrogen, ammonia, a hydrocarbon and an incompletely halogen-substituted hydrocarbon.

20. A method of etching a silicon-and-carbon-containing layer on a surface of a substrate in a substrate processing region, the method comprising the sequential steps of:
flowing reactive oxygen into the substrate processing region to reduce a concentration of carbon in a near-surface region of the silicon-and-carbon-containing layer;
thereafter, etching the silicon-and-carbon-containing layer by flowing a fluorine-containing precursor and a hydrogen-containing precursor into a first remote plasma region fluidly coupled to the substrate processing region while forming a plasma in the first remote plasma region to produce plasma effluents, which are flown into the substrate processing region; and
after the etching step, sublimating solid by-products left on the surface following the etching step by raising a temperature of the substrate above a sublimation temperature of the solid by-products.

21. The method of claim 20 wherein the fluorine-containing precursor comprises at least one precursor selected from the group consisting of nitrogen trifluoride, hydrogen fluoride, diatomic fluorine, monatomic fluorine and fluorine-substituted hydrocarbons.

22. The method of claim 20 wherein the hydrogen-containing precursor comprises at least one precursor selected from the group consisting of atomic hydrogen, molecular hydrogen, ammonia, a hydrocarbon and an incompletely halogen-substituted hydrocarbon.

23. The method of claim 20 wherein the reactive oxygen comprises ozone generated by flowing molecular oxygen ($O_2$) into a second remote plasma region.

24. The method of claim 23 wherein the first remote plasma region is the second remote plasma region.

25. The method of claim 20 wherein a thickness of about 150 Å or less is removed from the silicon-and-carbon-containing layer.

26. The method of claim 20 wherein the reactive oxygen comprises ozone generated in an ozone generator fluidly coupled to the substrate processing region.

27. The method of claim 20 wherein the steps are repeated to remove additional material from the silicon-and-carbon-containing layer.

28. The method of claim 27 wherein each repetition removes a thickness of about 150 Å or less from the silicon-and-carbon-containing layer.

29. The method of claim 20 wherein the reactive oxygen comprises ozone created by flowing oxygen ($O_2$) into the remote plasma region.

30. The method of claim 20 wherein a temperature of the substrate during the etching operation is less than or 100° C. and the temperature of the substrate during the sublimating operation is increased by at least 20° C. to a temperature greater than 100° C.

* * * * *